(12) United States Patent
Padmanaban et al.

(10) Patent No.: US 6,365,322 B1
(45) Date of Patent: Apr. 2, 2002

(54) PHOTORESIST COMPOSITION FOR DEEP UV RADIATION

(75) Inventors: Munirathna Padmanaban, Bridewater; Ralph R. Dammel, Flemington, both of NJ (US)

(73) Assignee: Clariant Finance (BVI) Limited (VG)

(*) Notice: Subject to any disclaimer, the term of this patent is extended or adjusted under 35 U.S.C. 154(b) by 0 days.

(21) Appl. No.: 09/455,872

(22) Filed: Dec. 7, 1999

(51) Int. Cl.$^7$ ............................................. G03F 7/004
(52) U.S. Cl. ................. 430/270.1; 430/326; 430/914; 430/921
(58) Field of Search .................... 430/270.1, 914, 430/921, 326

(56) References Cited

U.S. PATENT DOCUMENTS

| | | | |
|---|---|---|---|
| 4,491,628 A | 1/1985 | Ito et al. ..................... 430/176 |
| 5,350,660 A | 9/1994 | Urano et al. ................. 430/176 |
| 5,525,453 A | 6/1996 | Przybilla et al. ............ 430/170 |
| 5,843,319 A | 12/1998 | Przybilla et al. ............ 210/668 |
| 5,843,624 A | 12/1998 | Houlihan et al. ........... 430/296 |
| 5,879,857 A | 3/1999 | Chandross et al. ....... 430/270.1 |
| 6,103,450 A | * 8/2000 | Choi ....................... 430/270.1 |
| 6,146,810 A | * 11/2000 | Seo et al. ................. 430/270.1 |
| 6,207,342 B1 | * 3/2001 | Takechi et al. ........... 430/270.1 |

FOREIGN PATENT DOCUMENTS

| | | |
|---|---|---|
| EP | 0 677 788 A | 10/1995 |
| EP | 0 735 422 A | 10/1996 |
| EP | 0 789 278 A | 8/1997 |
| EP | 0 898 201 A | 2/1999 |
| EP | 989278 A2 | 3/2000 |
| GB | 2320718 | 7/1998 |
| GB | 2332679 | 6/1999 |
| WO | WO97/33198 | 9/1997 |

OTHER PUBLICATIONS

MacDonald S.A. et al "Airborne Chemical Contamination of a Chemically Amplified Resist", Advances in Resist Tech. SPIE 1466, pp. 2–12 (1991).
Ito H. "Deep UV Resists: Evolution and Status", Solid State Technology, pp. 164–173, Jul. 1996.
Ito, H. et al., SPIE vol. 1925, 65–75, 1993.
Nalamasu O. et al, J. Photopolymer Science and Technology, vol. 4, p. 299 (1991).
Roeschert H. et al, SPIE, vol. 1672, p. 33 (1992).
Funato S. et al, J. Photopolymer Science and Technology, vol. 8, pp. 543–553, 1995.
Nakano et al, SPIE 3333, p. 43 (1998).
Nozaki et al, J. Photopolymer Science and Technology, vol. 9, p. 11 (1998).
Wallow T.I. et al, SPIE 3333, p. 92 (1998).
Nozaki, K. et al. Jpn. J. Appl. Phys. vol. 35, 528–530, 1996.
Jung J.C. et al, SPIE 3333, p. 11 (1998).
Dammel R.R. et al SPIE 3333, p. 144 (1998).
Yamana et al, SPIE 3333, p. 32, 1998.
Rahman et al, SPIE vol. 3678, p. 1193 (1999).
Bowden et al, Photopolymer Science and Technology, vol. 12, No. 3, p. 423, 1999.
Willson C.G. et al, SPIE 3333, p. 425, 1998.
Nozaki, K. et al. Chem. Mater, vol. 6, 1492–1498, 1994.

* cited by examiner

Primary Examiner—Rosemary Ashton
(74) Attorney, Agent, or Firm—Sangya Jain

(57) ABSTRACT

The present invention relates to a novel photoresist composition sensitive in the deep ultraviolet region, where the photoresist performance is not adversely impacted by basic contaminants in the processing environment of the photoresist. The novel photoresist comprises a polymer, a photoactive compound, a basic compound that is a sulfonium or iodonium compound that is essentially nonabsorbing at the exposure wavelength of the photoresist, and a solvent composition. The invention further relates to a process for imaging such a photoresist in the deep ultraviolet region.

19 Claims, No Drawings

PHOTORESIST COMPOSITION FOR DEEP UV RADIATION

FIELD OF THE INVENTION

The present invention relates to a photoresist composition sensitive to radiation in the deep ultraviolet, particularly a positive working photoresist sensitive in the range of 100–300 nanometers(nm).

BACKGROUND OF INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed or the unexposed areas of the photoresist.

The trend towards the miniaturization of semiconductor devices has lead to the use of new photoresists that are sensitive to lower and lower wavelengths of radiation and has also led to the use of sophisticated multilevel systems to overcome difficulties associated with such miniaturization.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Photoresists sensitive to short wavelengths, between about 100 nm and about 300 nm can also be used where subhalfmicron geometries are required. Particularly preferred are photoresists comprising non-aromatic polymers, a photoacid generator, optionally a solubility inhibitor, and solvent.

High resolution, chemically amplified, deep ultraviolet (100–300 nm) positive and negative tone photoresists are available for patterning images with less than quarter micron geometries. To date, there are three major deep ultraviolet (uv) exposure technologies that have provided significant advancement in miniaturization, and these are lasers that emit radiation at 248 nm, 193 nm and 157 nm. Examples of such photoresists are given in the following patents and incorporated herein by reference, U.S. Pat. Nos. 4,491,628, 5,350,660, 5,843,624 and GB 2320718. Photoresists for 248 nm have typically been based on substituted polyhydroxystyrene and its copolymers. On the other hand, photoresists for 193 nm exposure require non-aromatic polymers, since aromatics are opaque at this wavelength. Generally, alicyclic hydrocarbons are incorporated into the polymer to replace the etch resistance lost by not having aromatics present. Photoresists sensitive at 157 nm may use fluorinated polymers, which are substantially transparent at that wavelength.

Chemically amplified resists, in which a single photo generated proton catalytically cleaves several acid labile groups, are used in photolithography applicable to sub quarter-micron design rules. As a result of the catalytic reaction, the sensitivity of the resulting resist is quite high compared to the conventional novolak-diazonaphthoquinone resists. But chemically amplified resists suffer from the so-called delay time effects. Photoresists based on a chemically amplified system comprise a polymer and a photoactive compound. The photoactive compound on exposure decomposes to form an acid. However, it is well known that the acid generated can diffuse from the exposed area to the unexposed area, hence causing a loss in image quality and resolution. Acid diffusion can result in changes in the dimensions of the imaged photoresist and in poor process latitude. Another issue is the loss of photogenerated acid on the surface of the latent image either due to evaporation of the acid or due to the reaction with the clean room amine contaminants. Acid loss on the surface leads to the formation of a severe surface insoluble layer in the exposed regions when there is a time delay between exposure and baking after exposure. Such problems of chemically amplified materials are well documented by several authors, including S. A. MacDonald et al. "Airborne Chemical Contamination of a Chemically Amplified Resist", in Advances in Resist Technology and Processing, Proceedings of SPIE 1466, 2–12 (1991) and H. Ito, "Deep-UV Resists: Evolution and Status", Solid State Technology pp164–173, July 1996. For instance, the resist left after exposure in a clean room environment with an ammonia concentration of as low as 10 ppb, develops T-tops (an insoluble resist layer on the surface of the exposed areas) as well as changes in the critical dimension occur. The reasons for such shortcomings of chemically amplified resists are:

(1) loss of acid or neutralization of the acid at the surface of the exposed areas of the resist by the base contaminants in the clean room atmosphere, and (2) diffusion of acid from the exposed areas to the non-exposed areas between exposure and development steps.

Several methods to control the problems associated with chemically amplified resists are proposed and used in production. An in-line production process, in which the resist is continuously processed without allowing any delays between exposure-post exposure bake and development steps and often enclosed from the clean room environment is one such method. This involves investment in the lithography tools as well as a preplanned production schedules with no interruptions. Another approach is the use of topcoats, often a polymeric film of few tens of nanometers coated upon the resist film. The film acts as a barrier layer between the resist and the clean room atmosphere, as discussed by O. Nalamasu et al. J. Photopolym. Sci. Technol. Vol. 4, p.299, (1991). This method however does not control the diffusion of the acid between exposed and non-exposed areas and involves an additional steps during the resist processing and therefore is not desirable. Yet another method uses the concept of annealing the resist films above the glass transition temperature, as disclosed in H. Ito et al. Proc. SPIE. Vol. 1925, P65 (1993). By baking above the glass-transition temperature, the resist film free volume is reduced and the diffusion of acid is more restricted. But it is necessary to optimize the glass transition temperature of the binder resin such that it is neither too low nor too high than the standard bake conditions. This may sometimes be done at the expense of the resist contrast. Incorporation of additives in the resist that controls the diffusion of the acid as well as the formation of T-tops is also reported and is perhaps the most effective way to eliminate T-tops, because such resists do not need additional processing steps and often do not involve extensive modifications to the original resist chemistry [H. Roeschert et al. Proc. SPIE, Vol. 1672, p33 (1992)].

The additives can be simple base compounds such as ammonium hydroxide or amines. The amines act as acid scavengers thus reducing the diffusion in to the unexposed areas. However, as a side effect, the resist sensitivity is usually reduced, thus lowering the throughput advantages characteristic for chemically amplified resists. Additionally there is a limit to the amount of base that can be added, before the photosensitivity becomes unacceptable.

The addition of photosensitive base compounds as compared to nonphotosensitive base compounds, to stabilize the latent images [U.S. Pat. No. 5,525,453 and S. Funato et al. J. Photopolym. Sci. & Tech. Vol. 8, p543–553 (1995)] offers the advantage of acid scavenging effect without losing the sensitivity. The photosensitive efficiently decomposes into the corresponding neutral fragments upon exposure, but remains intact in the unexposed areas.

Photoresists based on chemical amplification mechanism are employed for 248 and 193 nm applications. However, the resist materials applicable for 248 nm cannot be used at 193 nm due to the high absorption of the poly(4-hydroxystyrene) based polymers used for 248 nm applications. 193 nm applications typically require non-aromatic compounds. Open-chain aliphatic resins cannot be used due to the very high etch rates. Polymers possessing annelated structures in the side chains such as tricyclododecyl and adamantane or cycloolefins in the main chain are shown to provide etch resistance close to poly(4-hydroxystyrene) polymers [Nakano et al. Proc. SPIE 3333, 43 (1998), Nozaki et al. J. Photopolym. Sci. & Tech. Vol. 9, 11, (1998), T. I. Wallow et al. Proc. SPIE 3333, 92 (1998), and J. C. Jung et al. Proc. SPIE 3333, 11, (1998)]. For absorption reasons, additives employed in 248 nm cannot be used in 193 nm applications. This invention deals with a new combination of resin, photoactive compound and additive, which provide enhanced delay time stability.

A solution to the problem of acid diffusion was previously provided as disclosed in U.S. Pat. Nos. 5,525,453 and 5,843,319, for a system comprising a) a binder insoluble in water but soluble in an aqueous alkaline solution, b) a compound having at least one bond cleavable with an acid, c) a compound capable of producing an acid upon radiation, and d) a basic ammonium compound or a basic sulfonium compound.

The present invention relates to a chemically amplified system, which is, sensitive to wavelengths between 300 nm and 100 nm, has less components than the prior art, thus simplifying the manufacturing process, has a different polymer, and, furthermore, comprises a) a polymer that is insoluble an aqueous alkaline solution and comprises at least one acid labile group, b) a compound capable of producing an acid upon radiation, and c) a photosensitive basic sulfonium and/or iodonium compound. The present invention distinguishes over the prior art in that the polymer is internally inhibited from dissolving in water or the alkaline developer without the use of additional inhibiting components. The polymer is particularly suited for exposures below 200 nm, since it preferably does not contain aromatic functionalities that absorb at the wavelengths of irradiation. Polymers containing alicyclic functionalities or fluorinated polymers are particularly preferred.

SUMMARY OF INVENTION

The present invention relates to a novel photoresist composition sensitive to radiation in the deep ultraviolet, particularly a positive working photoresist sensitive in the range of 100–300 nanometers(nm). The photoresist composition comprises a) a polymer that is insoluble in an aqueous alkaline solution and comprises at least one acid labile group; b) a compound or a mixture of compounds capable of producing acid upon irrradiation, c) at least one photosensitive basic compound selected from a sulfonium and an iodonium compound; and d) a solvent. The photoresist is irradiated preferably with wavelength of light at 193 nm or 157 nm. The photosensitive basic compound is preferably trialkylsulfonium hydroxide or dialkyliodonium hydroxide. The invention also relates to a process of imaging the novel positive photoresist composition comprising the steps of: a) coating a substrate with the novel photoresist composition; b) baking the substrate to substantially remove the solvent; c) imagewise irradiating the photoresist film; d) baking the photoresist; and e) developing the irradiated film using an alkali developer.

DESCRIPTION OF THE INVENTION

The present invention relates to a photoresist composition sensitive to radiation in the deep ultraviolet, particularly a positive working photoresist sensitive in the range of 100–300 nanometers(nm). The photoresist composition comprises a) a polymer that is insoluble in an aqueous alkaline solution and comprises at least one acid labile group, b) a compound capable of producing an acid upon radiation, and c) a photosensitive basic sulfonium and/or iodonium compound. The photoresist is irradiated preferably with wavelength of light at 193 nm or 157 nm.

The polymer of the invention is one that has groups that make the polymer insoluble in aqueous alkaline solution, but such a polymer when catalysed by acid deprotects the polymer, wherein the polymer then becomes soluble in an aqueous alkaline solution. Such polymers are, for example, but not limited to, those described in U.S. Pat. Nos. 5,843, 624, 5,879,857, WO 97/133,198, EP 789,278 and GB 2,332, 679. Polymers that are preferred for irradiation at 193 nm are substituted acrylates and cycloolefins.

Polymers based on methacrylates with alicyclic moieties may be used, where the alicyclic groups, may be adamantyl, tricyclodecyl, isobornyl and menthyl may be used. Such polymers are described in the following references: R. R. Dammel et al., Advances in Resist Technology and Processing, SPIE, Vol. 3333, p144, (1998); Yamana et al., Advances in Resist Technology and Processing, SPIE, Vol. 3333, p 32, 1998; Nozaki et al. Jpn. J. Appl. Phys. Vol. 35, p528, (1996), and Nozaki et al., Chem. Mater, Vol. 6, p1492, (1994). Examples of these polymers include poly(2-methyl-2-adamantane methacrylate-co-mevalonic lactone methacrylate), poly(carboxy-tetracyclododecyl methacrylate-co-tetrahydropyranylcarboxytetracyclododecyl methacrylate), poly(tricyclodecylacrylate-co-tetrahydropyranylmethacrylate-co-methacrylicacid), poly(3-oxocyclohexyl methacrylate-co-adamantylmethacrylate).

Cycloolefins, with norbornene and tetracyclododecene derivatives, may be polymerized by ring-opening metathesis, free-radical polymerization or using metal organic catalysts. Cycloolefin derivatives may also be copolymerized with maleic anhydride or with maleimide or its derivatives. Such polymers are described in the following references M-D. Rahman et al., Advances in Resist Technology and Processing, SPIE, Vol. 3678, p1193, (1999); J. C. Jung et al., Advances in Resist Technology and Processing, SPIE, Vol.3333, p11, (1998); M-J. Bowden et al, J. Photopolym. Sci., & Tech., Vol. 12, No. 3, p423 (1999); C. G. Willson et al, Advances in Resist Technology and Processing, SPIE, Vol. 3333, p425, (1998). Examples of these polymers include poly((t-butyl 5-norbornene-2-carboxylate-co-2-hydroxyethyl 5-norbornene-2-carboxylate-co-5-norbornene-2-carboxylic acid-co-maleic an hydride), poly(t-butyl 5-norbornene-2-carboxylate-co-isobornyl-5-norbornene-2-carboxylate-co-2-hydroxyethyl 5-norbornene-2-carboxylate-co-5-norbornene-2-carboxylic acid-co-maleic anhydride), poly(tetracyclododecene-5-carboxylate-co-maleic anhydride) and the like.

The molecular weight of the polymers is optimized based on the type of chemistry used and on the lithographic performance desired. Typically, the molecular weight is in the range of 3,000 to 30,000 and the polydispersity is in the range 1.1 to 5, preferably 1.5 to 2.5.

Suitable examples of the acid generating photosensitive compound include onium-salts, such as, diazonium salts, iodonium salts, sulfonium salts, halides and esters, although any photosensitive compound that produces an acid upon irradiation may be used. The onium salts are usually used in a form soluble in organic solvents, mostly as iodonium or sulfonium salts, examples of which are diphenyliodoinum trifluoromethane sulfonate, diphenyliodoinum nonafluorobutanesulfonate, triphenylsulfonium trifluoromethanesulfonate, triphenylsulfonium nonafluorobutanesulfonate and the like. Other compounds that form an acid upon irradiation may be used, such as triazines, oxazoles, oxadiazoles, thiazoles, substituted 2-pyrones. Phenolic sulfonic esters, bis-sulfonylmethanes, bis-sulfonylmethanesor bis-sulfonyidiazomethanes, are also preferred.

The photosensitive basic sulfonium salt used in the present composition as an additive itself is known in the art, but is novel in combination with the components specified in the present invention. U.S. Pat. No. 5,525,453 discloses the use and synthesis of sulfonium salts. It is preferred that both the sulfonium and iodonium salts have good solubility, heat stability and preferably, have good transparency at the exposure wavelength. Where the photoresist composition is exposed with irradiation of wavelength less than 300 nm, it is preferred that the onium salt have the minimum degree of aromaticity, for example, there may be the minimum amount of phenyl groups. Therefore, phenyl sulfonium or iodonium salts can be used, but alkyl sulfonium or iodonium salts are preferred. The sulfonium or iodonium salts may be used alone or as mixtures.

Alkyl sulfonium or iodonium salts with purely aliphatic substituents or only limited aromatic substitution have little or no absorbance at exposure wavelengths above 190 nm. They therefore do not render the photoresist more opaque, which is desirable lithographically, since higher absorbance has a negative impact on the wall angle of the resist structures. As the onium salt has no absorption, one would expect that it is inert under exposure. However, it was surprisingly found that the basic onium salt is still neutralized by the action of light, as can be seen from the lower doses required for an equivalent amount of onium salt base compared to non-photoneutralizing bases. Without wishing to be bound by theory, it is believed that the photoneutralization occurs via a sensitization mechanism of the onium salt by other, absorbing components in the photoresist. It is thus possible to formulate photoresists with a photosensitive base that adds no or little absorption to the photoresist. This unexpected effect and the unexpected improvement in delay time stability constitute major improvements over the prior art.

The photosensitive basic sulfonium salt has the structure:

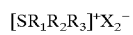

$[SR_1R_2R_3]^+X_2^-$ where, $R_1$, $R_2$ and $R_3$ are independently a $(C_1-C_{10})$ alkyl group, cyclic alkyl group, halo$(C_1-C_{10})$ alkyl group, aryl, heteroaryl group or substituted aryl group, $X_2$ is a basic anion having a pKa value of −3 to 5.

The aryl group is preferably phenyl. Substituted aryl is preferably a mono, di or tri substituted with $C_1-C_{10}$ alkyl, halogen or $(C_1-C_{10})$ alkoxy. $X_2$ represents a hydroxyl, or OR, OCOR or OCOO, where R is a $(C_1-C_4)$ alkyl. Preferably, trialkysulfonium hydroxide is used, and more preferably trimethylsulfonium hydroxide is used.

The photosensitive basic iodonium salt has the structure:

$[IR_1R_2]^+X_2^-$ where, $R_1$ and $R_2$ are independently a $(C_1-C_{10})$ alkyl group, cyclic alkyl group, halo$(C_1-C_{10})$alkyl group, aryl, heteroaryl group or substituted aryl group, $X_2$ is a basic anion having a pKa value of −3 to 5.

The aryl group is preferably phenyl. Substituted aryl is preferably a mono, di or tri substituted with $(C_1-C_{10})$ alkyl, halogen or $(C_1-C_{10})$ alkoxy. $X_2$ represents a hydroxyl, or OR, OCOR or OCOO, where R is a $(C_1-C_4)$ alkyl. Preferably, dialkyliodonium hydroxide is used, and more preferably, dimethyliodonium hydroxide is used.

The amount of the photosensitive base is from 5 mol % to 90 mol % with respect to the photoacid generator. More preferably, 10 mol % to 50 mol % is used.

The solid components of the present invention are dissolved in an organic solvent. The amount of solids in the solvent or mixture of solvents ranges from about 5 weight % to about 50 weight %. The polymer may be in the range of 5 weight % to 90 weight % of the solids and the photoacid generator may be in the range of 2 weight % to about 50 weight % of the solids. Suitable solvents for such photoresists may include propylene glycol mono-alkyl ether, propylene glycol alkyl (e.g. methyl) ether acetate, ethyl-3-ethoxypropionate, xylene, diglyme, amyl acetate, ethyl lactate, butyl acetate, 2-heptanone, ethylene glycol monoethyl ether acetate, and mixtures thereof.

Additives such as colorants, non-actinic dyes, anti-striation agents, plasticizers, adhesion promoters, coating aids, speed enhancers and surfactants may be added to the photoresist composition before the solution is coated onto a substrate. A sensitizer that transfers energy from a particular range of wavelengths to a different exposure wavelength may also be added to the photoresist composition.

The prepared photoresist composition solution can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist may also be coated over anti-reflective coatings.

The photoresist coatings produced by the described procedure are particularly suitable for application to aluminum/aluminum oxide coated wafers, such as are utilized in the production of microprocessors and other miniaturized integrated circuit components. A silicon/silicon dioxide wafer can also be used. The substrate may also comprise various polymeric resins, especially transparent polymers such as polyesters.

The photoresist composition solution is then coated onto the substrate, and the substrate is treated at a temperature from about 70° C. to about 150° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the solid components. In general, one desires to minimize the concentration of solvents and this first temperature treatment is conducted until substantially all of the solvents have evaporated and a thin coating of photoresist composition, on the order of half a micron (micrometer) in thickness, remains on the substrate. In a preferred embodiment the temperature is from about 95° C. to about 120° C. The treatment is conducted until the rate of change of solvent removal becomes relatively insignificant. The temperature and time selection depends on the photoresist properties desired by the user, as well as the equipment used and commercially desired coating times. The coating substrate can then be imagewise exposed to actinic radiation, e.g., ultraviolet radiation, at a wavelength of from about 100 nm (nanometers) to about 300 nm, x-ray, electron beam, ion beam or laser radiation, in any desired pattern, produced by use of suitable masks, negatives, stencils, templates, etc.

The photoresist is then subjected to a post exposure second baking or heat treatment before development. The heating temperatures may range from about 90° C. about 150° C., more preferably from about 100° C. to about 130° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in a developing solution or developed by spray development process. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides. One preferred developer is an aqueous solution of tetramethyl ammonium hydroxide. After removal of the coated wafers from the developing solution, one may conduct an optional post-development heat treatment or bake to increase the coating's adhesion and chemical resistance to etching conditions and other substances. The post-development heat treatment can comprise the oven baking of the coating and substrate below the coating's softening point or UV hardening process. In industrial applications, particularly in the manufacture of microcircuitry units on silicon/silicon dioxide-type substrates, the developed substrates may be treated with a buffered, hydrofluoric acid base etching solution or dry etching. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention. Unless otherwise specified, all parts and percents are by weight.

EXAMPLES

Comparative Example 1

119.995 g of poly(2-methyladamantyl methacrylate-co-2-mevaloniclactone methacrylate), 4.932 g of diphenyl iodonium nonafluorobutanesulfonate 0.07803 g diethanolamine (7.97 mol-% of the nonphotosensitive base relative to the photoacid generator), and 0.13044 g of surfactant (fluoroaliphatic polymeric ester, supplied by 3M Corporation, St. Paul, Minn.) were dissolved in 952.966 g of ethyl lactate to give a hotoresist solution. The solution was filtered using 0.2 µm filter. Separately, a bottom antireflective coated (B.A.R.C) silicon substrate was prepared by spin coating the bottom anti-reflective coating solution(ArF-1, available from Clariant Corporation, Somerville, N.J.) on to the silicon substrate and baked at 200° C. for 60 sec. The B.A.R.C film thickness was kept to 82 nm. The photoresist solution was then coated on the B.A.R.C coated silicon substrate. The spin speed was adjusted such that the photoresist film thickness was 451 nm. The resist film was baked at 115° C. for 60 sec. It was then exposed on a 193 nm ISI ministepper (numerical aperture of 0.6 and coherence of 0.7) using a chrome on quartz binary mask. After exposure, the wafer was post-exposure baked at 110° C. for 60 sec. Developing was carried out using 2.38 weight % aqueous solution of tetramethyl ammonium hydroxide for 60 sec. The line and space patterns were then observed on a scanning electron microscope. Delay time studies: To test the delay time stability, the wafers after exposure were kept for 10, 30, 60 and 120 minutes in the coating track (ammonia concentration of <3ppb) and then post-exposure baked just before the development step. When there was no delay time, the photoresist formulation thus prepared had a sensitivity of 12 mJ/cm$^2$ and showed linear resolution of 0.13 μm with no T-tops. The profiles were straight and free from T-tops when no delay time was allowed between the exposure and post-exposure bake temperature. However, with a delay time of greater than 30 minutes, severe T-tops were observed.

Comparative Example 2

3.49 g of polymer (made from 100 parts maleic anhydride, 85 parts t-butyl 5-norbornene-2-carboxylate, 10 parts 2-hydroxyethyl 5-norbornene-2-carboxylate, and 5 parts 5-norbornene-2-carboxylic acid), 0.042 g of triphenylsulfonium trifluoromethanesulfonate, 0.467 g of 1 weight % propylene glycol monomethyl ether acetate (PGMEA) solution of 1,3,3-trimethyl-6-azabicyclo[3.2.1] octane (30 mol % of the nonphotosensitive base relative to the photoacid generator), and 0.035 g of 10 weight % PGMEA solution of surfactant (fluoroaliphatic polymeric ester, supplied by 3M corporation, Minnesota) were dissolved in 24.96 g of PGMEA. The solution was filtered using 0.2 μm filter and processed in a similar manner to that described in Comparative Example 1. The formulation had a sensitivity of 10.5 mJ/cm$^2$ and a linear resolution of 0.15 μm. No T-tops were observed when there was no delay time between the exposure and post-exposure bake. However, with a delay time of 30 minutes, severe T-tops were observed.

Example 1

3.31 g of poly(2-methyladamantyl methacrylate-co-2-mevaloniclactone methacrylate), 0.136 g of diphenyl iodonium nonafluorobutanesulfonate, 0.192 g of 1 weight % methanol solution of trimethylsulfonium hydroxide (8.7 mol % of the photosensitive base with respect to the photoacid generator), and 0.036 g of 10 weight % ethyl lactate solution of surfactant (fluoroaliphatic polymeric ester, supplied by 3M corporation, Minnesota) were dissolved in 26.25 g of ethyl lactate. The solution was filtered using 0.2 μm filter and processed in a similar manner to that described in Comparative Example 1. A linear resolution of 0.13 μm was obtained at a dose of 7.5 mJ/cm$^2$.

Example 2

3.31 g of poly(2-methyladamantyl methacrylate-co-2-mevaloniclactone methacrylate), 0.136 g of diphenyl iodonium nonafluorobutanesulfonate, 0442 g of 1 weight % methanol solution of trimethylsulfonium hydroxide (20 mol % of photosensitive base, with respect to the photoacid generator) 0.036 g of 10 weight % ethyl lactate solution of a surfactant (fluoroaliphatic polymeric ester, supplied by 3M Corporation, St. Paul, Minn.) were dissolved in 26.25 g of ethyl lactate. The solution was filtered using 0.2 μm filter and processed in a similar manner to that described in Comparative Example 1. The photoresist formulation thus prepared had a sensitivity of 14 mJ/cm$^2$ and showed linear resolution of 0.13 μm. A delay of up to 60 minutes between exposure and post-exposure bake did not show any formation of T-tops while maintaining the sensitivity, resolution and profiles.

Example 3

3.31 g of poly(2-methyladamantyl methacrylate-co-2-mevaloniclactone methacrylate), 0.13 g of diphenyl iodonium nonafluorobutanesulfonate, 0.663 g of 1 weight % methanol solution of trimethylsulfonium hydroxide (30 mol % with respect to the photoacid generator), and 0.036 g of 10 weight % ethyl lactate solution of a surfactant (fluoroaliphatic polymeric ester, supplied by 3M Corporation, St. Paul, Minn.) were dissolved in 26.25 g of ethyl lactate. The solution was filtered using 0.2 μm filter and processed in a similar manner to that described in Comparative Example 1. The photoresist formulation thus prepared had a sensitivity of 23 mJ/cm$^2$ and showed linear resolution of 0.13 μm. A delay of up to 90 minutes between exposure and postexposure bake did not show any formation of T-tops.

Example 4

3.31 g of poly(2-methyladamantyl methacrylate-co-2-mevaloniclactone methacrylate), 0.13 g of diphenyl iodonium nonafluorobutanesulfonate, 0.884 g of 1 weight % methanol solution of trimethylsulfonium hydroxide (40 mol % with respect to the photoacid generator) 0.036 g of 10 weight % ethyl lactate solution of surfactant (fluoroaliphatic polymeric ester, supplied by 3M Corporation, Minnesota) were dissolved in 26.25 g of ethyl lactate. The solution was filtered using 0.2 μm filter and processed in a similar manner to that described in Comparative Example 1.

The photoresist formulation thus prepared had a sensitivity of 28 mJ/cm$^2$ and showed linear resolution of 0.13 μm. A delay of up to 90 minutes between exposure and post-exposure bake did not show any formation of T-tops.

Example 5

3.49 g of tetrapolymer (made from 100 parts maleic anhydride, 85 parts t-butyl 5-norbornene-2-carboxylate, 10 parts 2-hydroxyethyl 5-norbornene-2-carboxylate, and 5 parts 5-norbornene-2-carboxylic acid), 0.042 g of triphenylsulfonium trifluoromethanesulfonate, 0.287 g of 1 weight % methanol solution of trimethylsulfonium hydroxide (30 mol % with respect to the photoacid generator) and 0.035 g of 10 weight % PGMEA solution of a surfactant (fluoroaliphatic polymeric ester, supplied by 3M Corporation, St. Paul, Minn.) were dissolved in 26.25 g of PGMEA. The solution was filtered using 0.2 μm filter and processed in a similar manner to that described in Comparative Example 1.

The photoresist formulation thus prepared had a sensitivity of 18 mJ/cm$^2$ and showed linear resolution of 0.14 μm. A delay of up to 30 minutes between exposure and post-exposure bake did not show any formation of T-tops.

Example 6

111.51 g of poly(2-methyladamantyl methacrylate-co-2-mevaloniclactone methacrylate), 2.51 g of triphenyl sulfonium nonafluorobutanesulfonate, 10.50 g of 0.08 weight % methanol solution of trimethylsulfonium hydroxide (about 20 mol % with respect to the photoacid generator) 1.191 g of 10 weight % ethyl lactate solution of surfactant (fluoroaliphatic polymeric ester, supplied by 3M Corporation, Minnesota) were dissolved in 866.53 g of ethyl lactate. The solution was filtered using 0.2 μm filter and processed in a similar manner to that described in Comparative Example 1.

The photoresist formulation thus prepared had a sensitivity of 28 mJ/cm$^2$ and showed linear resolution of 0.13 μm. A delay of up to 90 minutes between exposure and post-exposure bake did not show any formation of T-tops.

What is claimed is:

1. A photoresist composition comprising an admixture of,
   a) a polymer that is insoluble in an aqueous alkaline solution and comprises at least one acid labile group;
   b) a compound or a mixture of compounds capable of producing acid upon irradiation;
   c) at least one basic compound selected from a sulfonium and an iodonium compound, further where the basic compound is nonabsorbing at an exposing wavelength used to expose the photoresist; and,
   d) a solvent composition.

2. The photoresist composition according to claim 1, where the composition is sensitive to wavelengths in the range of about 300 nm to about 100 nm.

3. The photoresist composition according to claim 1, where the polymer comprises alicyclic groups.

4. The photoresist composition according to claim 3, where the polymer has acrylate backbone with pendant alicyclic groups.

5. The photoresist composition according to claim 4, where the polymer is poly(2-methyladamantyl methacrylate-co-2-mevalonic-lactone methacrylate).

6. The photoresist composition according to claim 3, where the polymer has a backbone of alicyclic groups.

7. The photoresist composition according to claim 6, where the polymer is poly(maleic anhydride-co-t-butyl 5-norbornene-2-carboxylate-co-2-hydroxyethyl 5-norbornene-2-carboxylate-co-5-norbornene-2-carboxylic acid).

8. The photoresist composition according to claim 3, where the polymer is a copolymer of maleic anhydride and substituted and/or unsubstituted alicyclic monomers.

9. The photoresist composition according to claim 1, where the basic sulfonium compound has the structure, $$[SR_1R_2R_3]^+X_2^-$$

where
   $R_1$, $R_2$ and $R_3$ are independently a $C_1$–$C_{10}$ alkyl group, cyclic alkyl group or halo ($C_1$–$C_{10}$) alkyl group, and,
   $X_2$ is a basic anion having a pKa value of −3 to 5.

10. The photoresist composition according to claim 9, where $X_2$ is selected from hydroxyl, OR, OCOR and OCOOR, where R is a $C_1$–$C_4$ alkyl.

11. The photoresist composition according to claim 1, where the basic iodonium compound has the structure, $$[IR_1R_2]^+X_2^-$$

where,
   $R_1$, and $R_2$ are independently a $C_1$–$C_{10}$ alkyl group, cyclic alkyl group or halo ($C_1$–$C_{10}$) alkyl group; and,
   $X_2$ is a basic anion having a pKa value of −3 to 5.

12. The photoresist composition according to claim 11, where $X_2$ is selected from hydroxyl, OR, OCOR and OCOOR, wherein R is a $C_1$–$C_4$ alkyl.

13. The photoresist composition according to claim 1, where the basic sulfonium compound is trimethyl sulfonium hydroxide.

14. The photoresist composition according to claim 1, where the basic iodonium compound is dimethyliodonium hydroxide.

15. The photoresist composition according to claim 1, where the photosensitive basic sulfonium compound is present in the amount of about 5 mol % to about 50 mol % relative to the compound capable of producing an acid.

16. The process of imaging a positive photoresist composition comprising the steps of:
   a) coating a substrate with a film of photoresist composition of claim 1;
   b) baking the substrate to substantially remove the solvent;
   c) imagewise irradiating the photoresist film;
   d) baking the photoresist film; and,
   e) developing the irradiated photoresist film using an alkali developer.

17. The process of claim 16, wherein the photoresist film is imagewise irradiated using light of wavelength in the range of 100 nm to 300 nm.

18. The process of claim 16, wherein the heating in step d) ranges from a temperature of from about 90° C. to about 150° C. for from about 30 seconds to about 180 seconds on a hot plate or from about 15 minutes to about 40 minutes in an oven.

19. The process of claim 16, wherein the alkali developer comprises an aqueous solution of tetramethyl ammonium hydroxide.

* * * * *